United States Patent [19]

Warner

[11] Patent Number: 4,937,845
[45] Date of Patent: Jun. 26, 1990

[54] FAST LIBRARY ELEMENT GRAY CODE GENERATORS WITHOUT FEEDBACK AND FEEDFORWARD NETWORKS

[75] Inventor: Richard C. Warner, Morris Plains, N.J.

[73] Assignee: Plessey Electronic Systems Corp., Wayne, N.J.

[21] Appl. No.: 226,577

[22] Filed: Aug. 1, 1988

[51] Int. Cl.$^5$ .................. H03K 23/62; H03M 7/00
[52] U.S. Cl. ........................................ 377/34; 377/45; 377/125
[58] Field of Search .................... 377/33, 34, 45, 123, 377/125, 126

[56] References Cited

U.S. PATENT DOCUMENTS

| | | | |
|---|---|---|---|
| 2,834,011 | 5/1958 | Mork | 377/34 |
| 3,349,332 | 10/1967 | Bleickardt | 377/34 |
| 3,562,551 | 2/1971 | Fowler, Jr. | 377/44 |
| 3,588,461 | 6/1971 | Halsall | 377/34 |
| 4,618,849 | 10/1986 | Bruestle | 340/347 DD |
| 4,780,894 | 10/1988 | Watkins et al. | 377/34 |
| 4,845,728 | 7/1989 | Truong | 377/123 |

OTHER PUBLICATIONS

A New Explanation of the Reflected Binary Code, R. M. M. Oberman, Jun. 1974, IEEE Transactions on Computers.
Minimized Reversible LSSD Counter, IBM Technical Disclosure Bulletin, Nov. 1986-pp. 2717-2719.
Forward-Backward Counter for the Gray Code, Gilbert D. Beinhocker, Feb. 1960-p. 117, Control Engineering.
Fast Synchronous Gray Counter, Dan I Porat and Stanley Wojcicki, Feb. 1980-pp. 243-244, Nuclear Instruments & Methods.
"Gray Cyclic Coding Generations Using R-S Bistable Circuits", by S. L. Hurst, Aug. 1967-pp. 372-373, Electronics Letters.

*Primary Examiner*—John S. Heyman
*Attorney, Agent, or Firm*—David L. Davis

[57] ABSTRACT

An N stage Gray code generator includes an N stage binary counter having an input for receiving clock pulses to be counted and providing N outputs forming an N bit binary code. N minus 1 storage stages capable of being toggled between a logic "1" and a logic "0" state, each having a toggle input to cause them to toggle, have their toggle inputs coupled to the outputs of the first N minus 1 stages of the binary counter. The outputs of the N minus 1 storage stages form the first N minus 1 Gray code outputs and the most significant output of the binary counter provides the most significant output of the Gray code generator.

11 Claims, 8 Drawing Sheets

FAST LIBRARY ELEMENT GRAY CODE GENERATORS WITHOUT FEEDBACK AND FEEDFORWARD NETWORKS

BACKGROUND OF THE INVENTION

This invention is related to digital counters in general and more particularly to an improved high speed Gray code generator.

In the electronic computing art, various codes are utilized in addition to binary code. One such code is what is known as the Gray code. When using the Gray code, there are instances where digital counting in this code must be accomplished. Historically, Gray code counters have suffered from two problems. They tend to have a limited frequency of operation and are logically complex and difficult to understand. The first of these problems is the requirement for existing Gray counters in the prior art to include a feedback network from the more significant stages to the less significant stages coupled with a feedforward network from the less significant stages to the more significant stages in order to properly advance the count.

The second problem is that of having logic gate configurations at each stage that are unique on a per stage basis and which become progressively larger as the number of stages increases. This leads to a difficulty in understanding the logic and a difficulty in troubleshooting.

There are two circuits recently introduced on the market which may not be considered prior art to the present invention. These are elements, one manufactured by Plessey Semiconductors, known as Gray Code Counter, Plessey Part No. SP520B which is a library element, modulus 5 counter, and one logic macrocell design manufactured by LSI Logic Corp. known as a Modulo 256 Gray Counter, Design #C86, at p. 18-47 of the 1984 CMOS Macrocell Manual which also can be considered a library element counter. However, they still suffer from the first problem and consequently share the disadvantage that, as the number of bits in the counter increases, its frequency of operation decreases.

Thus, even in multi-stage counters utilizing the Plessey or LSI Logic semiconductor devices, there are severe frequency limitations. With the other types of prior art Gray counter in which discrete components or gates and flip-flops of integrated circuits are used to construct the counter, a device is obtained in which each stage may be different from every other stage and in which the logic unique to each stage grows in size and complexity as the number of stages increases.

As a result, all of the old methods have comparatively low frequencies of operation with the necessary delay between successive counts that increases in roughly linear fashion as the number of counting stages increases. The degree of linearity of this increase and delay is dependent on the exact implementation of the feedback and feedforward control logic networks.

In addition, in multi-stage devices that do not employ the Plessey or LSI Logic integrated circuit, the increase in component count and logic complexity leads to larger and more complex designs which are more difficult to understand and service.

In view of these problems, it is the object of the present invention to provide a Gray code generator which does not require a feedback network from the more significant stages to the less significant stages and which does not require a feedforward network from the less significant stages to the more significant stages.

Furthermore, it is the object to provide a true, stage-by-stage, library element design, i.e., a design in which all stages, except for the most significant stage, are identical.

It is an additional object to provide a design in which the frequency of operation is unaffected by the number of stages.

SUMMARY OF THE INVENTION

In accordance with the present invention, a Gray code generator is implemented by taking advantage of a heretofore unexploited relationship between the normal binary code and the Gray code. The relationship is that, in the case of an up count, the transition of any bit of the binary code from a logic "0" state to a logic "1" state is a signal that the corresponding bit of the Gray code should toggle. That is to say, if a particular Gray code bit position was a logic "0", it should change to a logic "1" and if it was a logic "1", it should change to a logic "0". In the case of a down count, the opposite logic of operation obtains: the change of any binary code stage from a logic "1" to a logic "0" is the signal that causes the corresponding bit of the Gray code to toggle. Furthermore, in counters of equal length of both binary code and Gray code, the most significant bits are identical.

Thus, in implementing the Gray code, the present invention utilizes a binary counter as the control element for the toggle control of signals to the corresponding bits of the Gray generator. In the illustrated embodiment, the Gray generator is implemented by a series of D-type flip-flops, one for each stage except for the last stage of the counter, the output of the last stage being taken directly from the last stage of the binary counter. What this means is that each stage of the generator comprises one stage of the binary counter plus one storage element capable of being toggled, e.g., a D-type flip-flop. Thus, the generator is made up of "library" elements. In one illustrated embodiment of the invention, each of these library elements comprises a dual D-type flip-flop integrated circuit. The last stage of the binary counter uses half of such an integrated circuit. Obviously, the length of the generator can be increased simply by adding more library elements.

In a second embodiment of the present invention shown in an implementation for a 16-bit generator, 4-bit binary counter chips are utilized to form the needed 16-bit binary counter. These provide the toggle inputs to D-type flip-flops which again can be dual D-type flip-flop integrated circuits. In this case, each library element comprises one 4-bit binary counter chip and two D-type flip-flop chips.

The embodiment utilizing a binary counter made up of D-type flip-flops has a binary counter which is a ripple counter. The other embodiment utilizing 4-bit binary counter chips utilizes synchronous counters and thus, is a synchronous binary counter.

Further embodiments demonstrate construction of a presettable up or down generator and up-down generators constructed via input inversion or by including both a negative counting and a positive counting input line.

In any case, the present invention is able to operate at many times the frequency of any previous device using the same gate technology, e.g., DTL, TTL and CMOS, etc., because there is no need for either feedback or feedforward circuitry, both of which are required in all previous approaches to the construction of a Gray counter.

The frequency of operation is independent of the number of bits or the length of the counter. In all previous implementations, an increment of propagation delay is introduced for each additional stage of count, so that a delay that is linearly proportional to the number of stages is introduced between counts. The proportionality constant resulting is difficult to characterize exactly since it is largely dependent upon the exact technology used in the exact configuration of the particular implementation. However, a rough assessment of comparative speeds between the present invention and the prior art would be approximately equal to the number of stages of count. In other words, a 16-bit generator constructed in accordance with the present invention will be able to operate at approximately sixteen times the count frequency of the similarly sized counter implemented using prior art methods.

The present invention can be constructed with a fewer number of gates than is possible with counters of the prior art because of this lack of feedback and feedforward circuits and consequently results in the use of less power. This is because slower, lower power consuming circuits can be used to achieve the same frequency of operation as the faster more power consuming circuits of the prior art.

The extreme regularity and simplicity of the circuits of the present invention, and their interconnections make them easy to understand and to troubleshoot. Because the present invention can be implemented as a ripple counter, this can result in a substantial saving in gates for the counter. The present invention is bit-slice expandable and can be built into an LSI macro as a time and error saving aid when the present invention is utilized in an LSI design.

DETAILED DESCRIPTION

Figure 1:
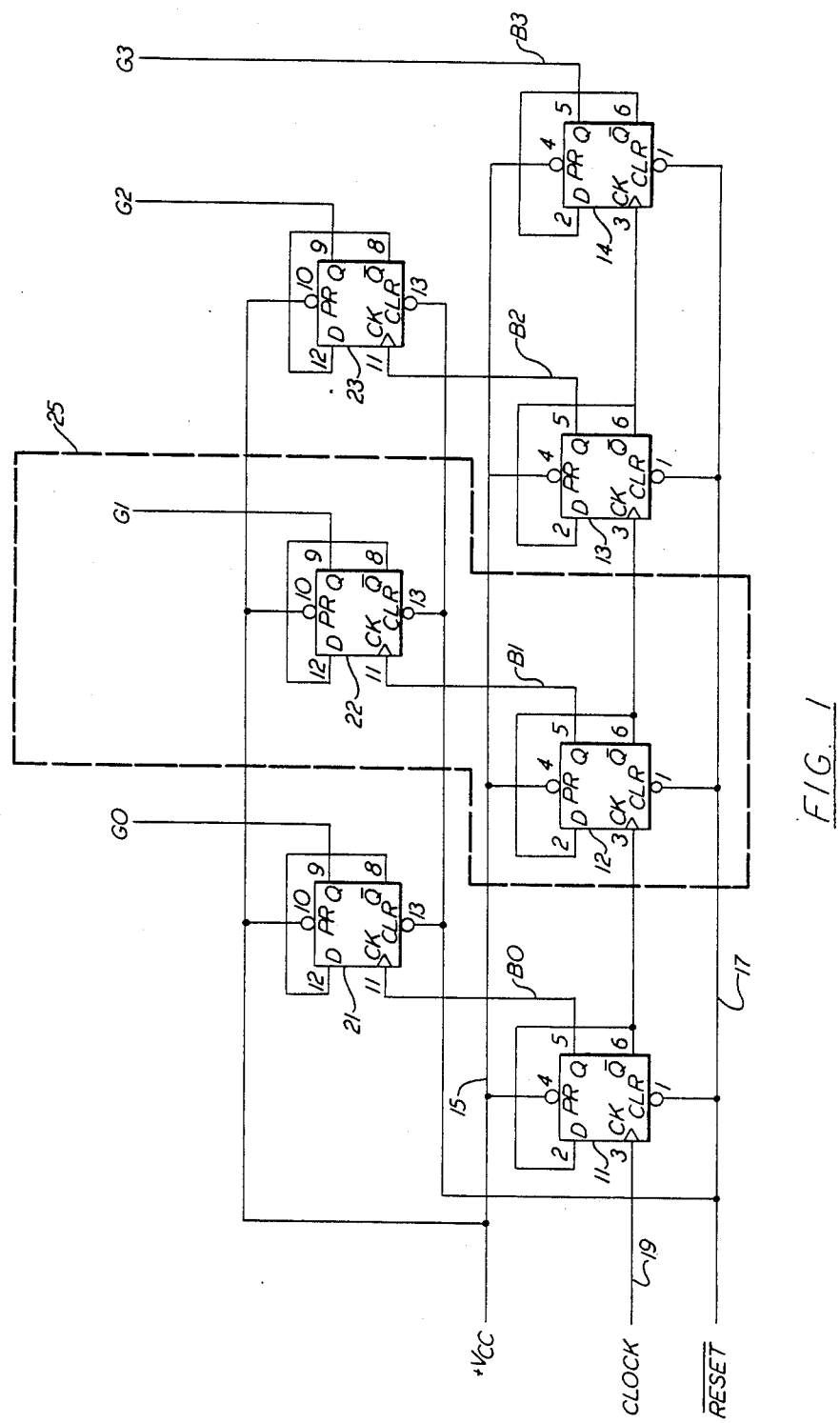
FIG. 1 is a logic diagram of a first embodiment of the present invention utilizing a 4-bit ripple binary counter.

FIG. 1 illustrates a first embodiment of the present invention. In the lower part of the Figure are four D-type flip-flops 11–14 connected to form a 4-bit binary counter. Each flip-flop has a D input, a clock input, a $\overline{Q}$ output and a Q output. Each flip-flop also has a preset input PR and a clear input CLR. The nomenclature used herein is as shown in section 5, "The TTL Data Book for Design Engineers", second edition, Texas Instruments, Inc., copyright 1981, third printing Each of the flip-flops 11–14 has its $\overline{Q}$ output tied back to its D input. The preset inputs are tied to a pull-up line 15 to provide a clean "logic '1'" state with maximum noise margin in order to prevent the flip-flops from being preset by noise. A negative reset line 17 is coupled to each of the clear inputs of the flip-flops 11–14. The clock input is provided on line 19 coupled to the clock input of the first flip-flop 11. The $\overline{Q}$ output of the flip-flop 11 is coupled to the clock input of the flip-flop 12, the $\overline{Q}$ output of which is in turn coupled to the clock input of the flip-flop 13, the $\overline{Q}$ output of which is in turn coupled to the clock input of the flip-flop 14. In a manner explained in more detail below, this forms a binary counter. Associated with each of the flip-flops 11, 12 and 13 is an additional D-type flip-flop 21,22, and 23 respectively. Thus, associated with flip-flop 11 is flip-flop 21, associated with flip-flop 12 is flip-flop 22 and associated with flip-flop 13 is flip-flop 23. These form Gray code output stages for the first three bits at the Q outputs of flip-flops 21–23, and the most significant bit at the Q output of the last binary flip-flop, in this case flip-flop 14, and are labeled Gray outputs G0 through G3. As with flip-flops 11–14, flip-flops 21–23 have their clear inputs CLR tied to the reset line 17 and their preset inputs PR tied to the pull-up line 15. Also, as with the flip-flops 11–14 they have their $\overline{Q}$ outputs tied back to their D inputs. In each case the clock or toggle input is coupled to the Q output of the associated binary counter flip-flop. Thus, flip-flop 21 is toggled by flip-flop 11, flip-flop 22 by flip-flop 12 and flip-flop 23 by flip-flop 13.

In the illustrated embodiment, generic TTL 54LS74A, dual D-type positive edge trigger flip-flops with preset and clear are utilized. The flip-flops 11 and 21, together, may form one chip, the flip-flops 12 and 22, together, another chip, and 13 and 23, together, a third chip. Flip-flop 14 comprises one-half of such a chip. The flip-flops 12 and 22 are shown within a dotted block 25 indicating a library element which can comprise one of these chips. By adding additional chips or library elements 25, the counter can be increased to any desired size.

The circuit of FIG. 1 is converted into a ripple down-counter by triggering the Gray code generator stages from the $\overline{Q}$ outputs of the corresponding binary counter stages instead of from the Q outputs, and triggering each binary stage from the Q output of the preceding binary stage. The Q output of the most significant stage of the binary counter is retained as the most significant bit of the Gray code generator. Other details of operation are the same as for operation as an up-counter.

Figure 2:
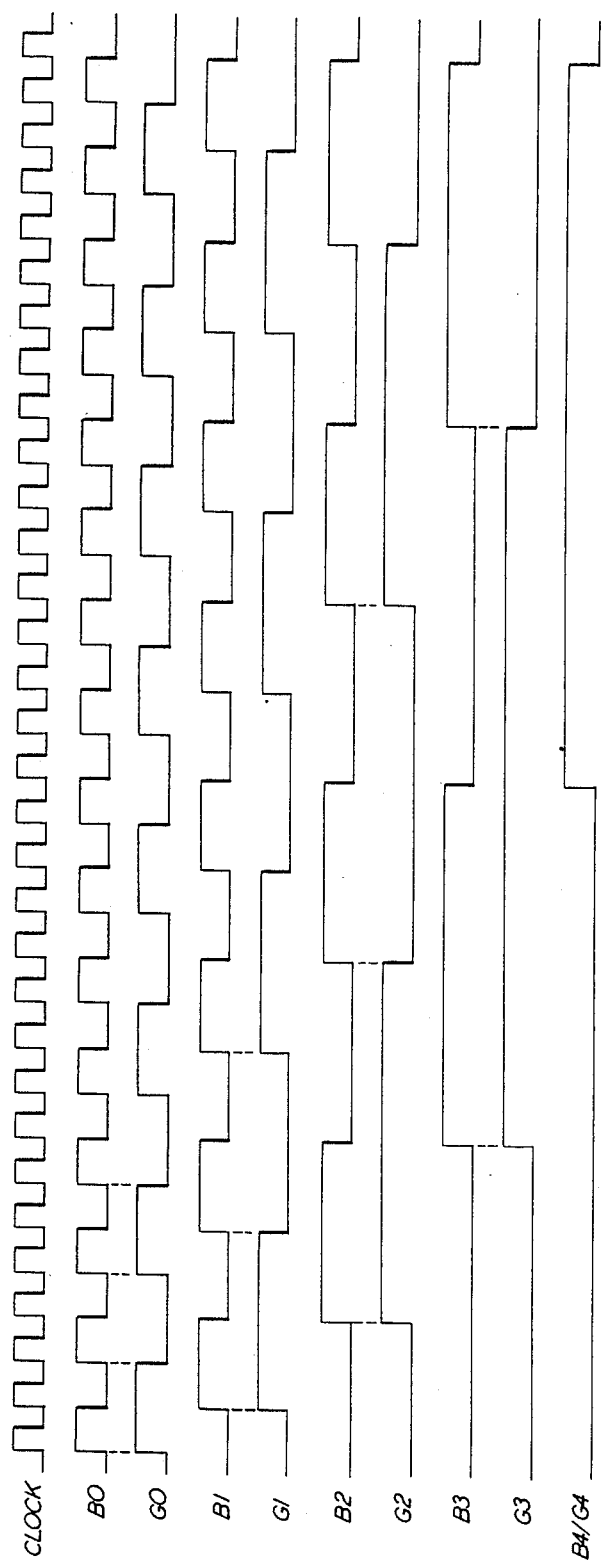
FIG. 2 is a timing diagram helpful in understand the principle of operation of the present invention.

Referring to FIG. 2 the principles behind the present invention will now be explained in greater detail.

As explained briefly in the Summary of the Invention section, the operation of this invention, in all its forms, is based on a heretofore unexploited relationship between the binary code and the Gray code. This relationship is the fact that, in the case of an upcount, as illustrated in FIG. 2, the transition of any bit of the binary code from a 'logic zero' state to a 'logic one' state is the signal that the corresponding bit of the Gray code should toggle, that is, if it was a 'logic zero' it should change to a 'logic one', and, if it was a 'logic one' it should change to a 'logic zero'.

In the case of a down-count, the opposite logic of operation obtains—the change of any binary code stage from a 'logic one' to a 'logic zero' is the signal to cause the corresponding bit of the Gray code to toggle. In both cases the most significant bit of the binary code is used as the most significant bit of the Gray code, because, in counters of equal length in both codes, the most significant bits are identical. In both cases, every binary counter stage, other than the most significant, is the trigger for the corresponding Gray code generator stage.

As illustrated by the timing diagram of FIG. 2, initially, all stages are reset. Because of this, the $\bar{Q}$ outputs of each of the flip-flops are at a logical "1", this logical "1" being fed back to the D input. The positive edge of the first clock pulse toggles flip-flop 11, causing the value at its D input to appear at its Q output. The $\bar{Q}$ output becomes zero. Thus, on the next positive edge of the clock pulse, there is a zero at the D input which gets transferred to the Q output. The $\bar{Q}$ output, not shown on FIG. 2, then goes from a logical "0" to "1". In similar fashion, the stages 13 and 14 are clocked by transitions from the preceding stages and the waveforms indicated as B0–B3 on the corresponding output lines result. When the Q output of flip-flop 11 went from a logical "0" to a logical "1", it clocked the flip-flop 21 causing its Q output to go from a logical "0" to a logical "1". Each subsequent time the Q output of flip-flop 11 has a positive going transition, it toggles flip-flop 21. The result is the waveform shown next to G0. This waveform has the same frequency as waveform B1 but is offset by one half cycle of the B0 stage from that waveform. This half cycle offset might better be considered to be one full cycle of the clock signal. Similarly, the B1 output toggles the flip-flop 22 to obtain the G1 output and the output of flip-flop 13 toggles flip-flop 23 to obtain the G2 output. The G3 output is the same as the B3 output for the embodiment of FIG. 1; however, in an expandable environment as illustrated in FIG. 2, it would be the Q output of the next Gray code flip flop (not shown). As can be seen from FIG. 2 there is, in the Gray code count a transition each time there is a transition in B0. However, the transition does not result in a binary code, but rather in the Gray code.

Figure 3:
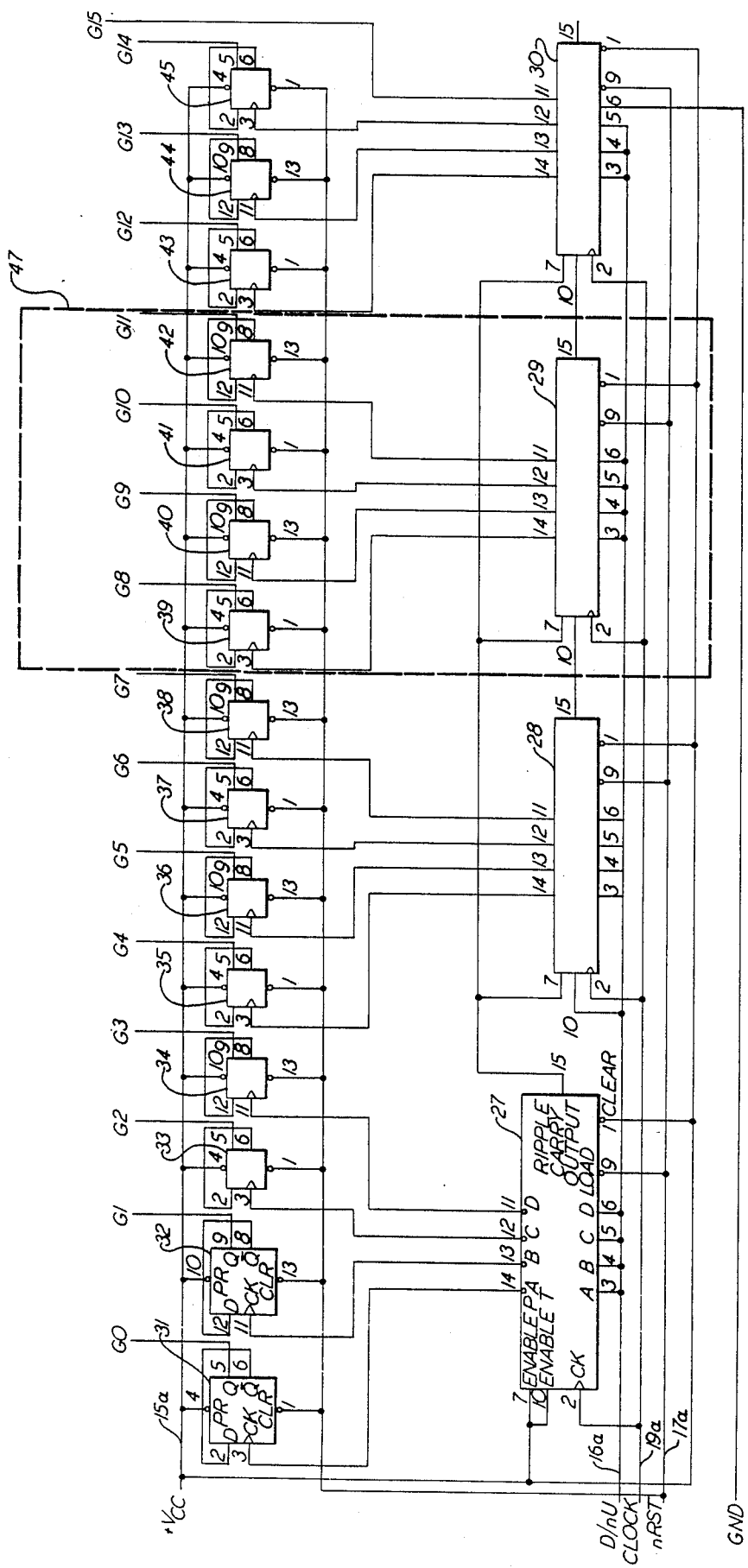
FIG. 3 is a logic diagram similar to FIG. 1 of a second embodiment of the present invention which may be preset for up or down counting utilizing a 16-bit parallel synchronous counter.

Referring to FIG. 3, there is illustrated a sixteen-bit parallel Gray code generator, that can be initialized as either an up-counter or a down-counter on lead 16a (but that cannot have its count direction switched once it has been started). Both (FIG. 1 and FIG. 3) can be increased in length to any desired extent simply by inserting additional identical stages at any appropriate point within the Gray code generator.

In this case, a 16 bit synchronous binary counter is implemented using 4-bit synchronous binary counter chips 27 through 30. These can be TTL 54LS161A synchronous 4-bit counters with an asynchronous clear. Once again, the output for the Gray code is accomplished using dual D-type positive edge trigger flip-flops with preset and clear. These comprise flip-flops 31–45. In this case, a library element is made up of one synchronous counter chip, and two dual D-type flip-flop chips, for example, as shown within the dotted block 47. Once again, there is a clock line providing inputs to the synchronous counters 27–30, a reset line 17a for resetting and a pull-up line 15a for maintaining a logic "1" on unused lines, such as preset. In the last group there are only three D-type flip-flops 43–45, since the final output G15 of the Gray code generator is the binary count output from binary counter stage 30. Operation is as described above, other than for the fact that the Gray code generator, in this case, is a synchronous Gray code generator.

In FIG. 3 the four, 4-bit binary counter stages 27, 28, 29 and 30, comprise a 16-bit binary counter. The dual D-type flip-flops 31,32 through 43, 44, inclusive, plus the used half of dual D-type flip-flop 45, in conjunction with the most significant output bit, G15, of the binary counter, comprise a 16-bit Gray code generator. In FIG. 3, the Q output of each stage of the binary counter, except for the most significant stage, acts as the trigger input to toggle the corresponding stage of the Gray code generator. The 'Q' output of the most significant stage of the binary counter is used directly as the most significant bit of the Gray code generator. In FIG. 3, the invention is initialized as an up-counter by bringing the nRESET line 17a to ground (logic '0'), bringing the D/nU input 16a to a 'logic zero', and supplying a clock pulse. Thereafter, the CLOCK input 19a serves to advance the count.

The circuit of FIG. 3, serves as either an up-counter or a down-counter. If, during the time of initialization, the D/nU input 16a is low (logic zero), the binary code generator is set to 'zero', and the Gray counter will count up. If the D/nU input 16a is high (logic one) at this time the binary counter is set to a value of $$2^{(N-1)}-1,$$

where N is the number of stages in the binary counter, and the Gray code generator will count down.

Gray code up-down counters can be constructed based on both the ripple and parallel binary counter approaches, through controlled inversion of the triggers to both the Gray and binary stages. Inversion can be accomplished in either of two ways: by inverting the trigger inputs to the Gray stages (either by switching them from the Q outputs of the binary stages to the $\bar{Q}$ outputs, or vice-versa, which inverts them, or by inverting them through the use of controlled exclusive-or gates or exclusive-nor gates while they remain connected to the same binary stage output), or through the use of two input lines, one for input pulses with a positive count sense, the other for input pulses with a negative count sense.

Extreme caution must be exercised whenever the inversion method is used, because, on average, half of the suddenly inverted trigger lines will appear, to their associated Gray stages, to go through bona fide trigger transitions. It is necessary, therefore, to either inhibit the triggering of the Gray stages in response to the change in state of their trigger inputs, or cause the Gray stages to trigger to the state in which they already are when this inversion is made. It is also necessary to inhibit any changes in the states of the binary stages when the count direction is inverted (this is already well documented in both literature and practice; see, for example, TTL, generic type 54LS191, SYNCHRONOUS UP/DOWN COUNTER WITH DOWN/UP MODE CONTROL, Page 7-296, The TTL Data Book for Design Engineers, Second Edition, 1981, TEXAS INSTRUMENTS.)

The Gray code generator shown in FIG. 3 must be preset to either count up or down.

Up-down counters, as referred to in this disclosure, are counters that can have their direction of count changed in midcount, as opposed to up-counters or down-counters or the presettable up or down counter of FIG. 3. Those are fixed in direction of count, either by their hardware configuration or by the direction in which they were set at initialization.

Figure 4:
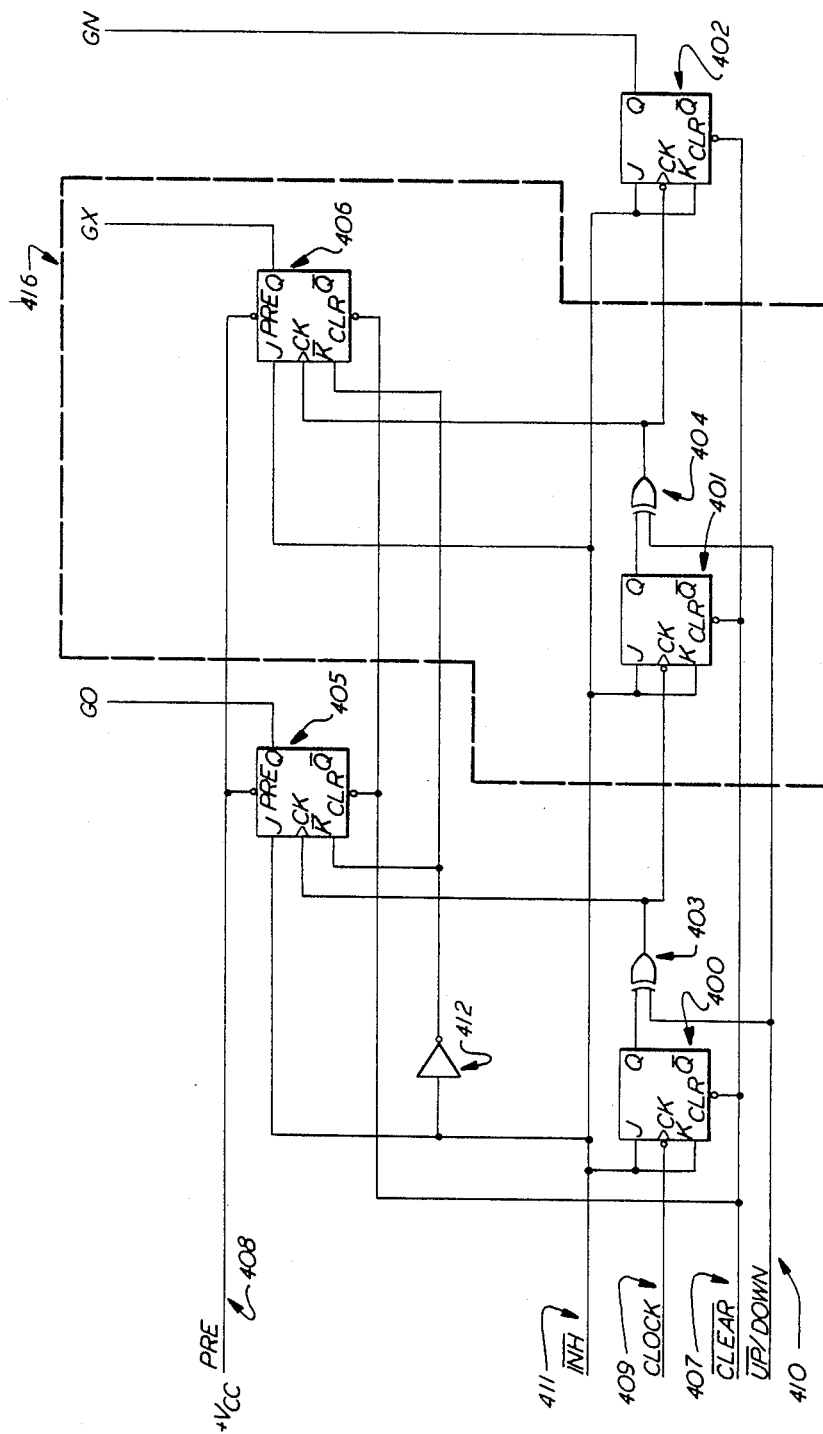
FIG. 4 is a logic diagram of a ripple, reversible, up-down Gray code generator constructed in accordance with the principles of the present invention.

FIG. 4, is an up-down Gray code generator based on a binary ripple counter. The binary ripple counter consists of three flip-flops 400, 401, 402, of generic type 54LS73A, and two exclusive-OR gates 403, 404, of generic type 54LS86, that control the direction of the binary counter. The Gray code generator consists of flip-flops 405, 406, of generic type 54LS109, and the last stage of the binary counter, flip-flop 402.

In the particular implementation shown, the two exclusive-OR gates 403, 404, that control the count direction of the binary counter, also control the inversion of the trigger inputs to the Gray code generator stages. The CLEAR input line 407 is used to initialize the invention. The PRE input line 408 is used to maintain the preset inputs of the Gray code generator stages in a logic '1' state (this line would not be required in an implementation in which the Gray code generator stages were constructed of flip-flops without preset inputs). The CLOCK input line 409 supplies count pulses to the code generator. The UP/DOWN input line 410 is used to preset or control count direction. The INH input line 411 is used to inhibit counting of both counters while the count direction is being changed, with inverter 412, of generic type 54LS04, supplying the inversion of the INH input for the K inputs, necessary to prevent toggling while the trigger inputs to the flip-flops 405, 406 of the Gray code generator are being inverted. The outputs of the Gray code generator consist of lines GO, GX and GN, where GO is the least significant bit of the Gray code generator, GX is any intermediate output of the Gray code generator, and GN is the most significant output of the Gray code generator (it is also the most significant output of the binary counter). The dotted box 416 constitutes a repeatable library element that may be duplicated and inserted as often as required, in order to extend the Gray code generator to any desired length.

The Gray ripple up-down mode-controlled code generator of FIG. 4 is similar in basic operation to the Gray code generator of FIG. 1. The three negative-type-triggered, J-K flip-flops 400, 401, 402, form its binary stages. When the UP/DOWN input 410 is low, this Gray code generator operates in the up-count mode because the exclusive OR gates 403, 404, operate in a non-inverting mode relative to the Q outputs of the Gray code generator stages that feed them, so that the falling edges of these Q outputs continue to look like falling edges, and therefore as clock pulses, to the next binary counter stages, while the rising edges continue to look like rising edges, and therefore as clock pulses to the GRAY stages. When the UP/DOWN input 410 is high, this Gray code generator operates in the down-count mode because the exclusive OR gates 403 and 404 operate in an inverting mode relative to the 'Q' outputs, thereby causing the formerly rising and falling edges to be inverted and become falling and rising edges, respectively. This causes the Gray code generator to operate in reverse. Because every internal clock line, that is, the outputs of the exclusive OR gates 403, 404, while being inverted, must look like a clock edge to one of the two flip-flops that it triggers, it is necessary to inhibit triggering while these outputs are in the act of having their polarities inverted. This is accomplished by the INH (INHIBIT NOT) input 411, which brings the J and K inputs of the binary stages to a logic '0' level, a condition in which the 54LS73 flip-flops will not toggle. The INH input 411 also brings the J inputs of the two Gray stages to a logic '0' condition, while operating through the inverter 412, to bring the K inputs to a logic '1' state, a condition that prevents these flip-flops from toggling. The CLEAR input 407 and the +Vcc (PRE) input 408 perform the same functions here that the RESET input 17 and the +Vcc input 15, respectively, perform in FIG. 1.

Gray up-down mode controlled Gray code generators, are count direction programmable. Two of these devices, one based on a binary ripple counter, the other based on a binary parallel counter, are illustrated in FIG. 4, already described, and 5, respectively, which show Gray code generators whose directions of count are controlled by an up-down mode control input. It is also possible to construct devices in which the instantaneous direction of count is determined by two count input leads, one for 'positive' counts and the other for 'negative' counts as will be explained with a description of FIG. 8.

Figure 5:
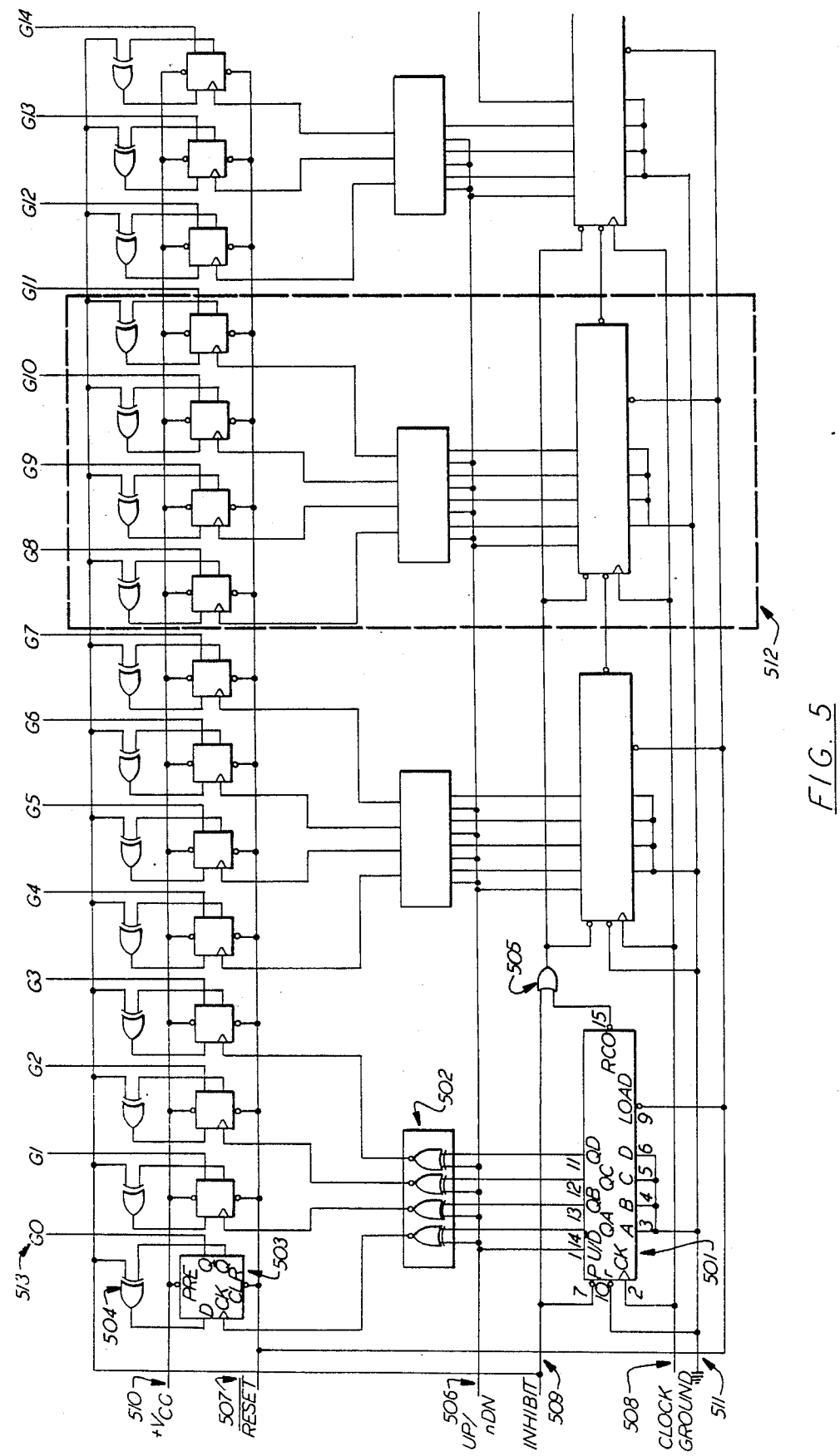
FIG. 5 is a logic diagram of a 16 bit, synchronous, reversible, up-down Gray code generator constructed in accordance with the principles of the present invention.

It is to be noted that, in the implementations of FIG. 4 and 5, it is necessary to inhibit the count function of both the Gray code generator and binary counter while the direction of count is in the act of being changed. This is necessary because some outputs of the binary counter will look like legitimate triggers to their associated Gray and/or binary stages, dependent upon the directions in which they are switched.

FIG. 5, shows a sixteen-bit, up-down, Gray code generator, based on a sixteen-bit, parallel up-down, binary counter. In the implementation shown, the binary stages consist of four generic type, TTL 54LS169A, synchronous 4-bit up/down counters, typified by element 501. The Gray code generator consists of fifteen halves of generic type TTL 54LS109A, dual J-nK, positive-edge-triggered flip-flops, typified by element 503, plus the Q output of the most significant stage of the binary counter. Exclusive-NOR gates, of generic type TTL 54LS266, typified by element 502, are used to reverse the polarity of the trigger pulses to the Gray code generator, in response to the UP/nDN input 506, which also controls the count direction of the binary counter stages. An INHIBIT input 509, is used to prevent changes from taking place in the counter while the count direction is being changed. Exclusive-OR gates, of generic type TTL 54LS86, typified by item 403, are used in conjunction with the INHIBIT input 509, to stabilize the Gray counter stages while the count direction is being changed. A positive-OR gate, of generic type TTL 54LS32, combines the INHIBIT function and normal counting function to the more significant stages of the binary counter. A GROUND input 511 is supplied to the parallel inputs of the binary counter, to cause that counter to preset to zero in response to the nRESET input 507, which also resets the Gray code generator stages. The +Vcc input 510 is supplied to maintain the unused inputs at a high logic '1' state. The CLOCK input 508 causes a count to take place. An insertable library element 512, can be used to increase the length of the Gray code generator.

The circuit of FIG. 5 is an up/down mode controlled device. The parallel binary counter stages 501 (and the three similar parts shown to its right) operate in the same manner as do those of FIG. 3, except for the additions of the INHIBIT line 506 and OR gate 505. The INHIBIT line 506 of FIG. 5 performs the same function as does the $\overline{\text{INH}}$ input 411 of FIG. 4. When the INHIBIT input goes high, it directly disables the count function of the first quadruple stage of the binary counter 501. At the same time, it causes the output of OR gate 505 to go high, which in turn disables the count function of the remaining stages of the binary counter. It also causes exclusive-OR gate 504, in the data feedback path of flip-flop 503, and all other exclusive-OR gates that perform similar functions for their associated flip-flops, to operate in an inverting mode. When counting is inhibited in the binary counter, the direction of count can be changed, without upsetting the count, by inverting the sense of the UP/nDN input 506. When the direction of count is changed, all of the exclusive-NOR gates 502, and the other, unnumbered exclusive-OR gates, to the right of 502, invert the sense of the trigger inputs to the Gray code generator stages. Some of these changed trigger inputs, half of them on average, will change from a logic '0' to a logic '1', and will therefore appear to be legitimate trigger inputs. At this time, however, the exclusive-OR gates 504, having been caused by the INHIBIT input 509, to operate in an inverting mode, in turn cause those flip-flops of the Gray code generator that are triggered to trigger to the state in which they already are, thereby preventing any change from taking place in the Gray count. The +Vcc input 510 is provided to maintain a clear logic '1' on the unused inputs of the flip-flops of the Gray code generator. The GROUND input 511 provides the logic '0' level required by the inputs to the binary counter to set it to a zero count when the nRESET line 507 is brought low, to load the binary counter (in this case to a count of zero) and reset the Gray code generator (also to a count of zero). The CLOCK line 508 causes the system to count in whatever direction is currently specified.

Figure 6:
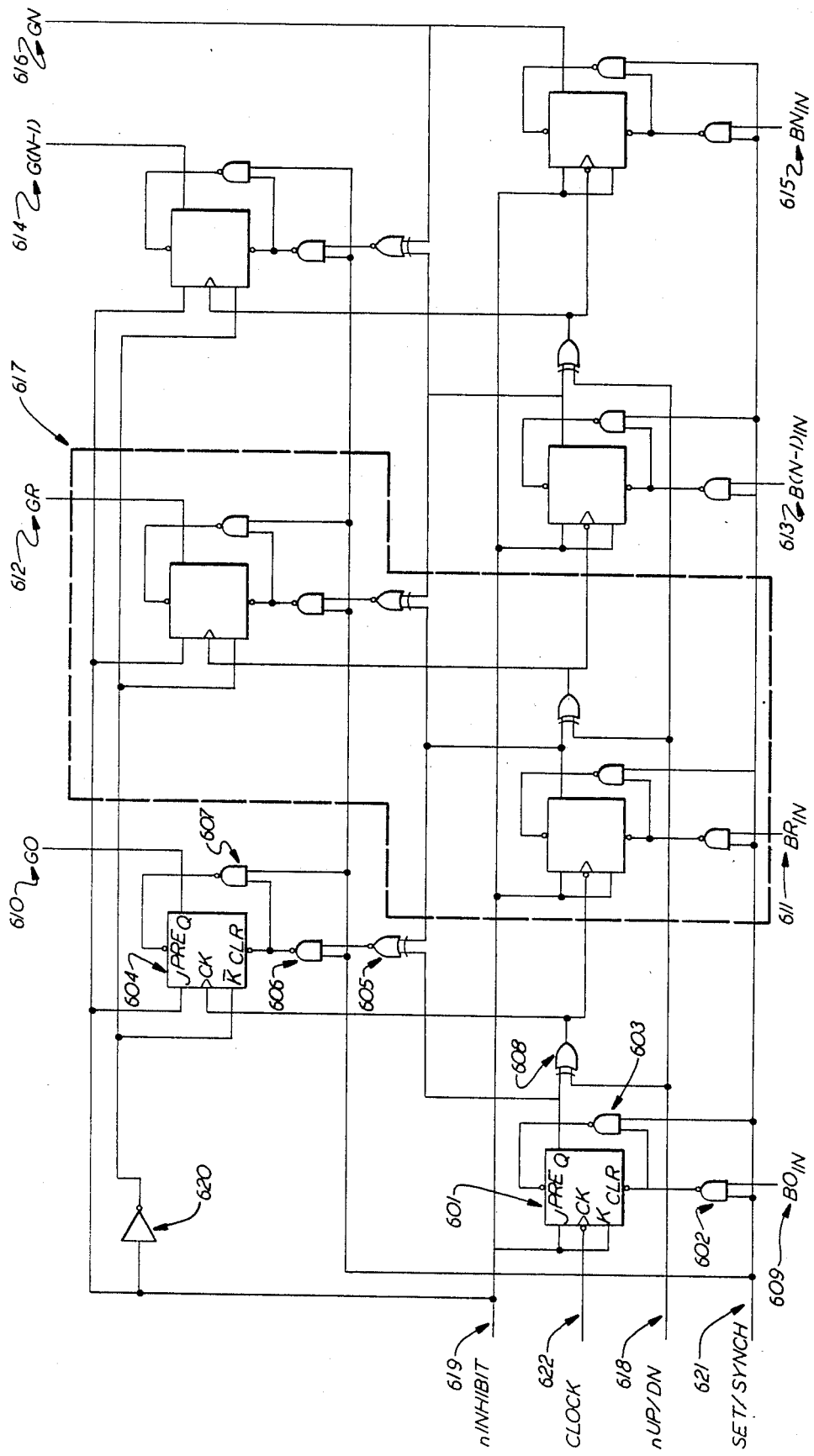
FIG. 6 is a logic diagram of a count presettable, reversible up-down, Gray ripple code generator constructed in accordance with the principles of the present invention.

Referring to FIG. 6, there is shown a presettable, up-down, Gray ripple code generator. This code generator consists of a ripple binary counter controlling the Gray code generator stages. The ripple binary counter consists of four halves of generic type TTL 54LS112A, dual J-K negative-edge-triggered flip-flops with PRESET and CLEAR, typified by item 601, eight NAND gates, of generic type TTL 54LS00, 2-input positive-NAND gates, typified by items 602 and 603, and three generic type TTL 54LS86, 2-input exclusive-OR gates, typified by item 608. The Gray code generator consists of three counting stages, each composed of a generic type TTL 54LS109 dual J-K positive-edge-triggered flip-flop with preset and clear, typified by item 604, two NAND gates 606 and 607, identical to items 602 and 603, one generic type TTL 54LS266 2-input exclusive-NOR gate 605, and the Q output 616 of the most significant stage of the binary counter. Leads B0$_{in}$ 609, BR$_{in}$ 611, B(N−1)$_{in}$ 613, and BN$_{in}$ 615, supply input data for presetting the code generator stages. The SET/SYNCH 621 input is supplied to preset the code generator. The nUP/DN 618 input controls count direction. The nINHIBIT 619 input and a generic type TTL 54LS04, inverter 620, stabilize the code generator while the direction of count is being changed. The CLOCK 622 input causes the code generator to count. A library element 617 is shown comprising the elements of the dashed line box.

Figure 7:
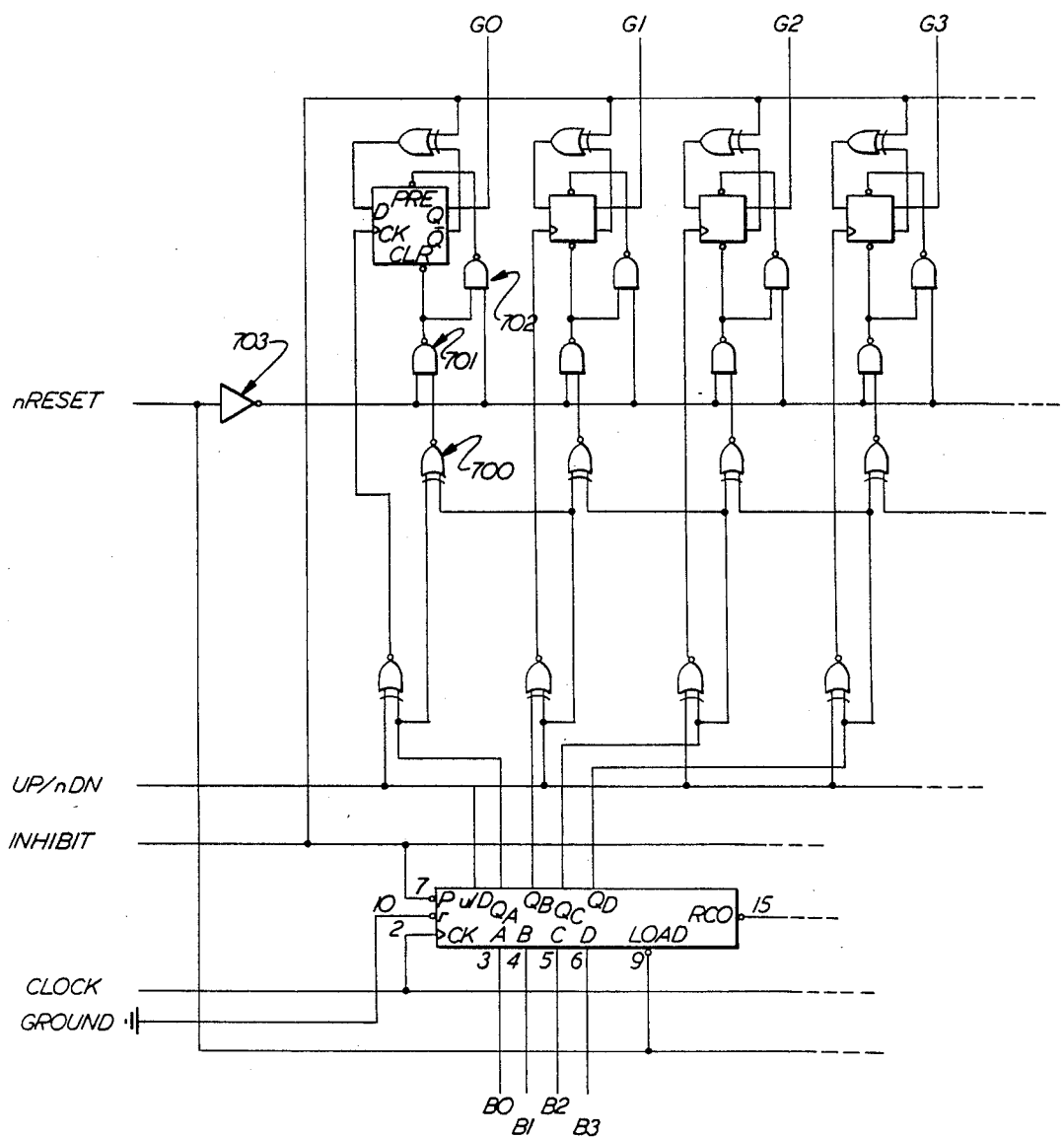
FIG. 7 is a logic diagram of one common library element of a count presettable, parallel, up-down Gray code generator constructed in accordance with the principles of the present invention.

FIG. 7, shows the changes necessary to transfer the Gray code generator of FIG. 5 from an up-down parallel Gray code generator, into a presettable, up-down, parallel Gray code generator. The necessary modifications have been shown applied to the first four bits of FIG. 5. The extension of these modifications to the remainder of FIG. 5 will be readily understood by persons skilled in the art. The functions of the nRESET input (item 507 of FIG. 5) and the +Vcc input (item 510 of FIG. 5) relative to the Gray code generator stages have been replaced by a synchronization/set network for each bit of the Gray code generator. This network consists of, for the least significant bit, exclusive-OR gate 700, NAND gate 701, and NAND gate 702, which are identical in both form and function to exclusive-OR gate 605, NAND gate 606, and NAND gate 607, respectively, all of FIG. 6. Identical changes have been made to each of the other bit slices of FIG. 7. An inverter 703, identical in form and function to inverter 620, of FIG. 6, has also been added. The +Vcc input 510 of FIG. 5, is no longer required. No other changes are required.

Figure 8:
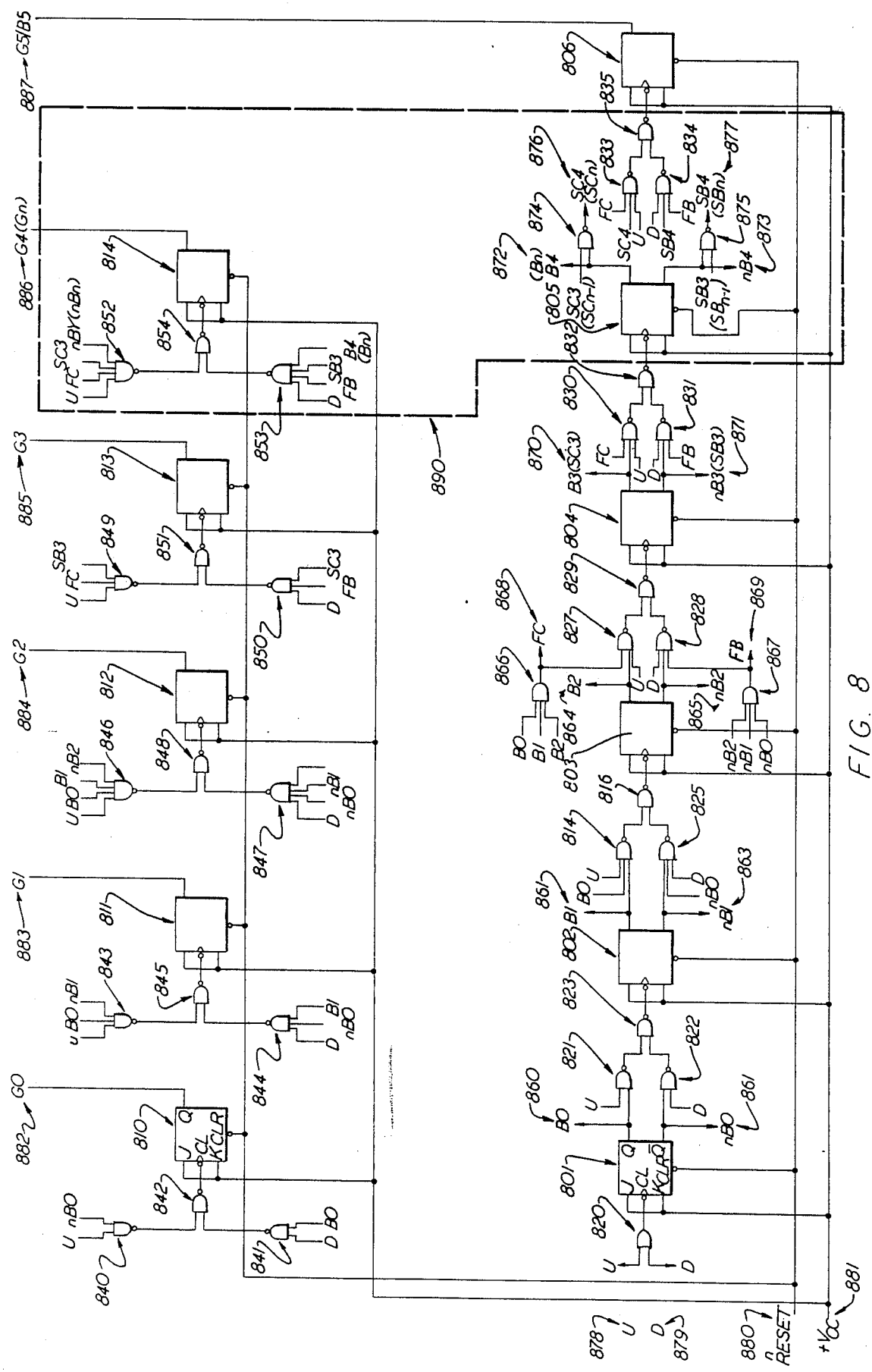
FIG. 8 is a logic diagram of an up-down parallel Gray code generator having positive and negative counting pulse input lines.

Lastly, FIG. 8 is an up-down, parallel Gray code generator that uses two input lines, one for counts with a positive sense 878, and one for counts with a negative sense 879. The binary counter stages of this device consist of flip-flops FFB0 801, FFB1 802, FFB2 803, FFB3 804, FFB4 805, FFB5 806, which are generic types TTL 54LS73, in the implementation shown. The logic networks fulfilling the requirements of equations (3) and (4) as described hereafter, which control the counting functions of the binary stages, consist of the two-input OR gate 820, two-input NAND gates 821, 822, 823, 816, 829, 832, 874, 875 and 835, and three-input NAND gates 814, 825, 827, 828, 866, 867, 830, 831, 833 and 834. The Gray code generator stages consist of generic type TTL 54LS73 flip-flops FFG0 810, FFG1 811, FFG2 812, FFG3 813, and FFG4 814. The logic networks that fulfill the requirements of equations (5) through (11), inclusive, that control the toggling of the Gray code generator stages, consist of two-input NAND gates 840, 841, 842, 845, 848, 851, and 854, three-input NAND gates 843, 844, 849, and 850 and four-input NAND gates 846, 847, 852 and 853. The U input 878 causes the counter to count up. The D input 879 causes the Gray code generator to count down. The nRESET input 880 initializes the device. The +Vcc input 881 is supplied to all the J and K inputs of both sets of Gray code generator stages so that counting is continuously enabled. The outputs of the Gray code generator are G0 882, G1 883, G2 884, G3 885, G4 886, and G5/B5, which latter is the Q output of the most significant stage of the binary Gray code generator. It should be noted that the counter of FIG. 8 can be made into a count presettable counter by adding networks typified by gates 602, 603, 605, 606 and 607, of FIG. 6, and including a SET/SYNCH input.

The following Boolean logic equations in this section define the operation of the two-input Gray up-down code generator of FIG. 8, with regard to the counting functions only. Other functions, such as system reset, are relatively simple and will be readily understood, upon inspection of FIG. 8, by anyone skilled in the art. Terms used in these equations are defined as follows:

Bn The 'Q' output of the nth binary stage.

nBn (Bn NOT): The 'nQ' output of the nth binary stage.

D Denotes a down-count pulse input.

f(T) Used before the name of a flip-flop, defines the following equation as the requirement for triggering that flip-flop. In the implementation of FIG. 8, all triggering takes place on the falling (trailing) edge of the associated U (up-count) or D (down-count) pulse input.

FB Fast Borrow (or Look-ahead Borrow). Enables fast binary count-down by by-passing the serial propagation of the borrow signal from the lowest order stages of the binary counter.

FC Fast Carry (or Look-ahead Carry). Enables fast binary count-up by by-passing the serial propagation of the carry signal from the lowest order stages of the binary counter.

FFBn The flip-flop that is the nth stage of the binary counter.

FFGn The flip-flop that is the nth stage of the Gray code generator.

Gn The 'Q' output of the nth Gray stage.

nGn (Gn NOT): The 'nQ' output of the nth Gray stage.

n (1) Used preceding a signal, denotes the dual of the named signal. (2) Used following a signal, would refer to the nth occurrence of the signal of that generic name (i.e.; G3 denotes the output of the 4th Gray stage: stages run from 0 upward)

SBn Slow Borrow. Saves gate area by permitting a serial propagation of the Borrow signal from the more significant stages of the binary counter, where there is time for this type of propagation. The lower case 'n' is indicative of the highest order of the binary counter that is incorporated in that particular level of the SB signal.

SCn Slow Carry. Saves gate area by permitting a serial propagation of the Carry signal from the more significant stages of the binary counter, where there is time for this type of propagation. The lower case 'n' is indicative of the highest order of the binary counter that is incorporated in that particular level of the SC signal.

U Denotes an up-count pulse input.

\* Boolean symbol for a LOGIC AND function.

\+ Boolean symbol for a LOGIC OR function.

The Boolean equations, then, of operation are as follows:

$$FB = (nB0) * (nB1) * (nB2) \tag{1}$$
$$FC = (B0) * (B1) * (B2) \tag{2}$$
$$f(T)B0 = (D) + (U) \tag{3}$$
$$f(T)Bn = (U) * (B0) * (B1) * \cdots * (Bn-1) + \tag{4}$$
$$(D) * (nB0) * (nB1) * \cdots * (nBn-1)$$
$$f(T)G0 = (U) * (nB0) + (D) * (B0) \tag{5}$$
$$f(T)G1 = (U) * (B0) * (nB1) + (D) * (nB0) * (B1) \tag{6}$$
$$f(T)G2 = (U) * (B0) * (B1) * (nB2) + \tag{7}$$
$$(D) * (nB0) * (nB1) * (B2)$$
$$f(T)G3 = (U) * (B0) * (B1) * (B2) * (nB3) + \tag{8}$$
$$(D) * (nB0) * (nB1) * (nB2) * (B3) =$$
$$(U) * (FC) * (SB3) + (D) * (FB) * (SC3)$$
$$f(T)G4 = (U) * (FC) * (SC3) * (nB4) + \tag{9}$$
$$(D) * (FB) * (SB3) * (B4)$$
$$f(T)Gn = (U) * (FC) * (SCn-1) * (nBn) + \tag{10}$$
$$(D) * (FB) * (SBn-1) * (Bn)$$
$$f(T)Gn = U * (B0) * (B1) * \cdots * (Bn-1) * (nBn) + \tag{11}$$
$$D * (nB0) * (nB1) * \cdots * (nBn-1) * (Bn)$$
$$SB3 = nB4 \tag{12}$$
$$SB4 = (SB3) * (nB4) \tag{13}$$
$$SBn = (SBn-1) * (nBn) \tag{14}$$

NOTE: (SBn), where (n = 3), would be used in Gray code generators longer than that shown in FIG. 8.

$$SC3 = B3 \tag{15}$$
$$SC4 = (SC3) * (B4) \tag{16}$$
$$SCn = (SCn-1) * (Bn) \tag{17}$$

NOTE: (SCn), where (n = 3), would be used in counters longer than that shown in FIG. 8.

$$\text{RESET} = \text{RESET (All stages of both counters)} \tag{18}$$

Specific embodiments of the present invention have been illustrated. There are, however, many ways in which the present invention can be implemented. For example, the circuits can be implemented with discrete devices or in any level of integrated circuit. Furthermore, any integrated circuit technology, such as RTL, DTL, PMOS, NMOS, CMOS, IIL, ECL and so on, can be used in addition to the LSTTL which has been described in connection with the embodiments of FIGS. 1 and 3–8. Furthermore, a mixture of these technologies can be used. Other types of circuit elements than those illustrated can be used. For example, the basic requirement of the output stages of the Gray code generator is that they be a device than can be toggled. Thus, other types of flip-flops may be utilized to implement these. Finally, and again by way of example, the present invention can be implemented as a parallel or synchronous counter or a ripple counter or a combination of the two.

What is claimed is:

1. An N stage Gray code generator comprising:
   an N stage binary counter having an input for receiving clock pulses to be counted and providing N outputs forming an N bit binary code, where N is an integer greater than one;
   N−1 binary storage elements each capable of being toggled between a logic "1" stage and a logic "0" stage, each element having a toggle input and responsive to a signal at said toggle input for toggling between said logic states, the toggle inputs of said N−1 storage elements being coupled to respective outputs of the first N−1 stages of said binary counter, the outputs of said N−1 storage elements forming the first N−1 Gray code generator outputs, with the most significant output of said binary counter providing the most significant output of said Gray code generator;
   count direction control means for controlling said binary counter to selectively increment or decrement its count in response to a clock pulse; and
   inhibit means cooperating with said count direction control means for inhibiting said binary counter stages and said storage elements from changing state while said count direction control means is in the process of changing state while said count direction control means is in the process of changing the count direction;
   said binary counter being comprised of toggleable elements coupled to that the output of a less significant element toggles the next more significant element, thereby forming a ripple counter and the N−1 less significant stages of the Gray code generator are made up of library elements each comprising two toggleable elements, one such element comprising a stage of the binary counter and the other such element comprising one of said storage elements;
   wherein said toggleable elements comprise D-type flip-flops, each D-type flip-flop having a clock input, a data input and complementary outputs, with one of its complementary outputs being coupled to its data input, and with the clock inputs of each of the storage element D-type flip-flops being coupled to the other of said complementary outputs of a corresponding D-type flip-flop comprising a stage of the binary counter.

2. A counter according to claim 1, wherein one binary counter stage and one storage element are together incorporated in a dual D-type flip-flop integrated circuit, thereby forming a one-stage library element.

3. A Gray code generator according to claim 1, wherein when said generator functions as an incrementer, said storage elements are coupled to be toggled when a corresponding binary stage output changes from a "0" to a "1".

4. A Gray code generator according to claim 1, wherein when said generator functions as a decrementer, said storage elements are coupled to toggle when a corresponding binary stage changes from "1" to a "0".

5. A Gray code generator according to claim 1 further comprising:
means for providing a binary signal representation of an initial count which may assume any integer value between 0 and $2^N-1$;
means for loading said binary signal representation into said binary counter; and
means for propagating said binary signal representation from the output of said binary counter to said N−1 binary storage elements.

6. An N stage Gray code generator comprising:
an N stage binary counter having an input for receiving clock pulses to be counter and providing N outputs forming an N bit binary code, where N is an integer greater than one;
N−1 binary storage elements each capable of being toggled between a logic "1" state and a logic "0" state, each element having a toggle input and responsive to a signal at said toggle input for toggling between said logic states, the toggle inputs of said N−1 storage elements being coupled to respective outputs of the first N−1 stages of said binary counter, the outputs of said N-1 storage elements forming the first N−1 Gray code generator outputs, with the most significant output of said Gray code generator;
count direction control means for controlling said binary counter to selectively increment or decrement its count in response to a clock pulse; and
inhibit means cooperating with said count direction control means for inhibiting said binary counter stages and said storage elements from changing state while said count direction control means is in the process of changing the count direction;
wherein said binary counter comprises M multiple bit counting devices each having P stages where N is equal to M times P, and wherein the Gray code generator is made up of library elements, each element comprising one counting device, and comprising P toggleable elements providing the Gray code outputs.

7. A Gray code generator according to claim 6, wherein each counting device comprises a multiple bit counting circuit and said toggleable elements comprise D-type flip-flops whereby each library element comprises one multiple bit counting circuit and one D-type flip-flop per bit.

8. A Gray code generator according to claim 7, wherein said multiple bit counting devices comprise synchronous counters.

9. A Gray code generator according to claim 6, wherein when said generator functions as an incrementer, said storage elements are coupled to be toggled when a corresponding binary stage output changes from a "0" to a "1".

10. A Gray code generator according to claim 6, wherein when said generator functions as a decrementer, said storage elements are coupled to toggle when a corresponding binary stage changes from a "1" to "0".

11. A Gray code generator according to claim 6, further comprising:
means for providing a binary signal representation of an initial count which may assume any integer value between 0 and $2^N-1$;
means for loading said binary signal representation into said binary counter; and
means for propagating said binary signal representation from the output of said binary counter to said N−1 binary storage elements.

* * * * *